(12) United States Patent
Langlais et al.

(10) Patent No.: US 7,277,511 B2
(45) Date of Patent: Oct. 2, 2007

(54) TWO-STAGE NON-LINEAR FILTER FOR ANALOG SIGNAL GAIN CONTROL IN AN OFDM RECEIVER

(75) Inventors: Brian James Langlais, Mississippi Mills (CA); Akrum Elkhazin, Toronto (CA); John Fanson, Ottawa (CA); Bradley Robert Lynch, Ottawa (CA); Xi Chu, Ottawa (CA)

(73) Assignee: Intellon Corporation, Ocala, FL (US)

( * ) Notice: Subject to any disclaimer, the term of this patent is extended or adjusted under 35 U.S.C. 154(b) by 601 days.

(21) Appl. No.: 10/145,151

(22) Filed: May 15, 2002

(65) Prior Publication Data

US 2003/0215032 A1 Nov. 20, 2003

(51) Int. Cl.
*H04L 27/08* (2006.01)
(52) U.S. Cl. .................. 375/345; 375/229; 455/241.1
(58) Field of Classification Search ............... 375/230, 375/233, 229, 316, 345, 350, 232, 346; 370/319, 370/344, 480, 310, 315, 316, 343, 464; 341/139; 455/149, 194.2, 218, 219, 230, 232.1, 240.1, 455/241.1, 247.1, 334, 341, 130, 150.1, 194.1, 455/234.1
See application file for complete search history.

(56) References Cited

U.S. PATENT DOCUMENTS 3,716,789 A * 2/1973 Brown et al. ............... 704/212
3,745,374 A * 7/1973 Hecker et al. ............... 327/351
3,946,211 A * 3/1976 Jenkins, Jr. .................. 702/195
4,862,387 A * 8/1989 Lee ............................. 358/1.2
4,910,797 A * 3/1990 Min et al. ................. 455/249.1
5,564,080 A * 10/1996 Eul et al. ....................... 455/69
5,724,652 A 3/1998 Graham et al. ........... 455/234.1
5,873,054 A * 2/1999 Warburton et al. ......... 702/190
6,091,932 A 7/2000 Langlais ..................... 455/5.1
6,122,331 A 9/2000 Dumas ....................... 375/345
6,194,996 B1 2/2001 Okazaki et al. ........ 340/310.01
6,226,337 B1 5/2001 Klank et al. ................. 375/367
6,229,432 B1 5/2001 Fridley et al. ......... 340/310.01
6,242,981 B1 6/2001 Tomiyama .................. 330/254
6,246,285 B1 6/2001 Nishikido .................... 330/132
6,369,741 B1 * 4/2002 Demicheli et al. .......... 341/155
6,724,840 B1 4/2004 Osofsky et al.
6,732,059 B2 * 5/2004 Warburton et al. ........... 702/78

\* cited by examiner

*Primary Examiner*—Pankaj Kumar
*Assistant Examiner*—Naheed Ejaz
(74) *Attorney, Agent, or Firm*—Fish & Richardson P.C.

(57) ABSTRACT

An analog signal gain control circuit(ASGC) for a digital radio HomePlug orthogonal frequency division multiplexing (OFDM) receiver includes a digital variable gain amplifier (DVGA) to control the gain of a received signal to achieve a desired signal amplitude to match a dynamic range of an analog-to-digital converter (ADC), an inverse scaling stage controlled to inverse-scale the signal output by the ADC, and a two-stage fast attack and slow decay filter that outputs control signals to the DVGA and to the inverse scaling stage. The fast attack and slow decay filter rapidly responds to an increase in signal amplitude and slowly decays the amplitude of the control signal in response to a decrease in input signal amplitude.

28 Claims, 5 Drawing Sheets

TWO-STAGE NON-LINEAR FILTER FOR ANALOG SIGNAL GAIN CONTROL IN AN OFDM RECEIVER

CROSS-REFERENCE TO RELATED APPLICATIONS

This is the first application filed for the present invention.

TECHNICAL FIELD

The present invention relates to automatic gain control and, in particular, to a two-stage non-linear filter for analog signal gain control in an OFDM receiver.

BACKGROUND OF THE INVENTION

Home electric power distribution wiring is used for delivering electric current to home appliances. This power distribution network can also be used to transmit signals to provide communications between analog or digital devices. It has been recognized for some time that there are distinct advantages to using power distribution networks for networking computerized devices, but there are very few interfaces available for connecting devices to power distribution networks. It is also well known that power distribution networks are subject to high levels of electrical noise, and that noise affects the quality of signal transmission. Power distribution networking therefore requires interfaces with receivers that have extended capability for extracting useful signals from the wide spectrum of signals present on the electrical wiring of a home power distribution network.

A multi-carrier technique referred to as orthogonal frequency division multiplexing (OFDM) is widely used for power distribution networking, because this technique is robust and permits multi-path propagation. The OFDM technique, which is well known in the art, includes a transmitter and a receiver. The receiver normally has an amplifier with automatic gain control (AGC). The function of the AGC is to adjust an amplitude of an input signal to match an amplitude range of an analog-to-digital converter (ADC) to inhibit signal clipping by the ADC. The characteristics of AGC governs the quality of some aspects of the communications receiver.

Many methods for AGC are taught in the prior art, they are used in audio, video, radio, digital radio, cellular phones, etc. The main purpose of AGC is to adjust the amplitude of the incoming signal so that it matches a preferred operating range of the ADC and to produce a high quality output signal.

U.S. Pat. No. 6,122,331 issued to Dumas on Sep. 19, 2000 and is entitled "Digital Automatic Gain Control". Dumas describes a complicated AGC that includes a gain correction unit that is responsive to attenuate and amplify commands issued from a feedback system that monitors the output of the AGC. The feedback system not only detects when gain changes are required, but also determines an optimal time at which the gain should be changed. The AGC also includes a transition region detector which responds to an increase or decrease communicated in a gain control command. If the magnitude of the input signal is greater than a predetermined value, then the transition region detector places a disable signal on its control output to prevent the gain correction unit from altering the gain. A disadvantage of this system is its complexity.

The principal problem that must be considered when designing an AGC is that, in terms of cost/complexity, the trade off between sampling rate and dynamic range of the A/D converter must be considered. In Power distribution networking, receivers must accommodate a large analog input dynamic range, and a large digital output dynamic range. However, affordable A/D converters have a limited dynamic range at normal sampling rates.

There therefore remains a need for a low-cost digital signal gain control circuit that is relatively simple, and seamlessly integrates the A/D converter into the receiver to provide an accurate absolute measurement of the incoming signal amplitude to enable an output signal of high quality.

SUMMARY OF THE INVENTION

It is therefore an object of the invention to provide a low cost digital signal gain control circuit that is relatively simple and combines the advantages of analog and digital AGC, while ensuring a quality output signal.

The invention therefore provides an OFDM receiver that includes a two-stage non-linear fast attack and slow decay filter, and a method for analog signal gain control (ASGC) in an OFDM receiver. The receiver is highly responsive to increases in signal amplitude, while being simple to construct and inexpensive to manufacture.

The invention also provides fast attack filter circuit and a slow decay filter circuit which are connected in series and provide a fast response to increases in amplitude of an input signal. Together they control a gain of a digital variable gain amplifier (DVGA) that has fixed logarithmic amplification steps for matching a dynamic range of an analog-to-digital converter (ADC). The fast attack filter circuit detects an increase in signal amplitude and provides an output signal for changing a gain control signal of the DVGA, while the slow decay filter circuit ensures a slow decay of a level of the control signal.

The invention also provides a fast attack filter that includes a first multiplier for multiplying a digital input signal by a predefined first coefficient and outputting a second digital signal to a first adder. A first delay element stores a third digital signal received from the first adder. A second multiplier multiplies a fourth digital signal received from the first delay element by a second predefined coefficient to output a fifth digital signal to the first adder. The first adder sums the second digital signal with a fifth digital signal and outputs the second digital signal to the first memory.

The invention also provides a slow decay filter, that includes a third multiplier for multiplying the fourth digital signal retrieved from the first delay element by a predefined third coefficient and outputting a sixth digital signal to a second adder; a second delay element for storing a seventh digital signal received from the second adder; a comparator for comparing the fourth digital signal retrieved from the first delay element and an eighth digital signal retrieved from the second delay element and outputting a ninth digital signal which is a maximum of the fourth and the eighth digital signals; a fourth multiplier for multiplying the ninth digital signal received from the comparator by a predefined fourth coefficient and outputting a tenth digital signal to a second adder; and a second adder summing the tenth digital signal with the sixth digital signal and outputting the seventh digital signal to the second delay element for storage. The eighth digital signal is output from the second delay element to control the DVGA performed by the AGC.

The invention also provides an analog signal gain control (ASGC) for a HomePlug digital radio orthogonal frequency division multiplexing (OFDM) receiver. As is well known, HomePlug is an industry consortium promoting a unified standard for powerline networking technology. The ASGC includes a digital variable gain amplifier (DVGA) for gaining a first analog signal to match a predefined dynamic range and outputting a second analog signal to a digital conditioning stage; a digital conditioning stage for converting an input analog signal into a digital signal and conditioning that digital signal and outputting a second digital signal; and a feedback stage for receiving the second digital signal, analyzing and outputting a first control signal for controlling the gain steps of the DVGA and outputting a second control signal for controlling the digital conditioning stage.

The invention also provides a digital conditioning stage which includes an ADC for digitally converting the second analog signal and outputting a first digital signal; and an inverse scaling stage for multiplying the first digital signal by a reciprocal of the gain of the DVGA and outputting a second digital signal to the feedback stage.

The invention also provides a feedback stage which includes an amplitude detector for receiving the second digital signal, calculating an absolute value of the second digital signal and outputting a third digital signal to a fast attack and slow decay filter; the fast attack and slow decay filter for calculating the power representation of the third digital signal and, according to a predefined algorithm, outputting a fourth digital signal to an amplitude comparator; the amplitude comparator for receiving and modifying the fourth digital signal, and for outputting the first control signal for controlling the DVGA and for input to a pipeline delay stage; and the pipeline delay stage for delaying the first control signal by a predetermined time period and outputting the second control signal to the inverse scaling stage.

According to another aspect of the invention there is provided a method of controlling a gain of a digital variable gain amplifier (DVGA) using a fast attack and slow decay filter. The method comprises the step of computing the gain for the DVGA by indirectly analyzing an amplitude of an input signal to the DVGA using a fast attack filter and a slow decay filter.

Advantageously, the invention provides a control of the DVGA that has fixed logarithmic gain steps either 6 dB or 2 dB, each of which cover at least a 36 dB range.

Advantageously, the invention also includes a fast attack and slow decay filter that provides a rapid response at the start of a packet to prevent clipping and an accurate measurement of the signal power by the end of a first OFDM symbol to minimize quantization noise.

Advantageously, the invention also provides an ASGC control with low digital complexity and accurately scaled amplitude output over a large dynamic range.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The invention provides an analog signal gain control (ASGC) circuit for a digital radio orthogonal frequency division multiplexing (OFDM) receiver that controls input signal amplification using a digital variable gain amplifier DVGA) to achieve a desired input signal amplitude for matching a dynamic range of an analog-to-digital converter (ADC) of the receiver. The DVGA is controlled by a two-stage non-linear filter.

Figure 1:
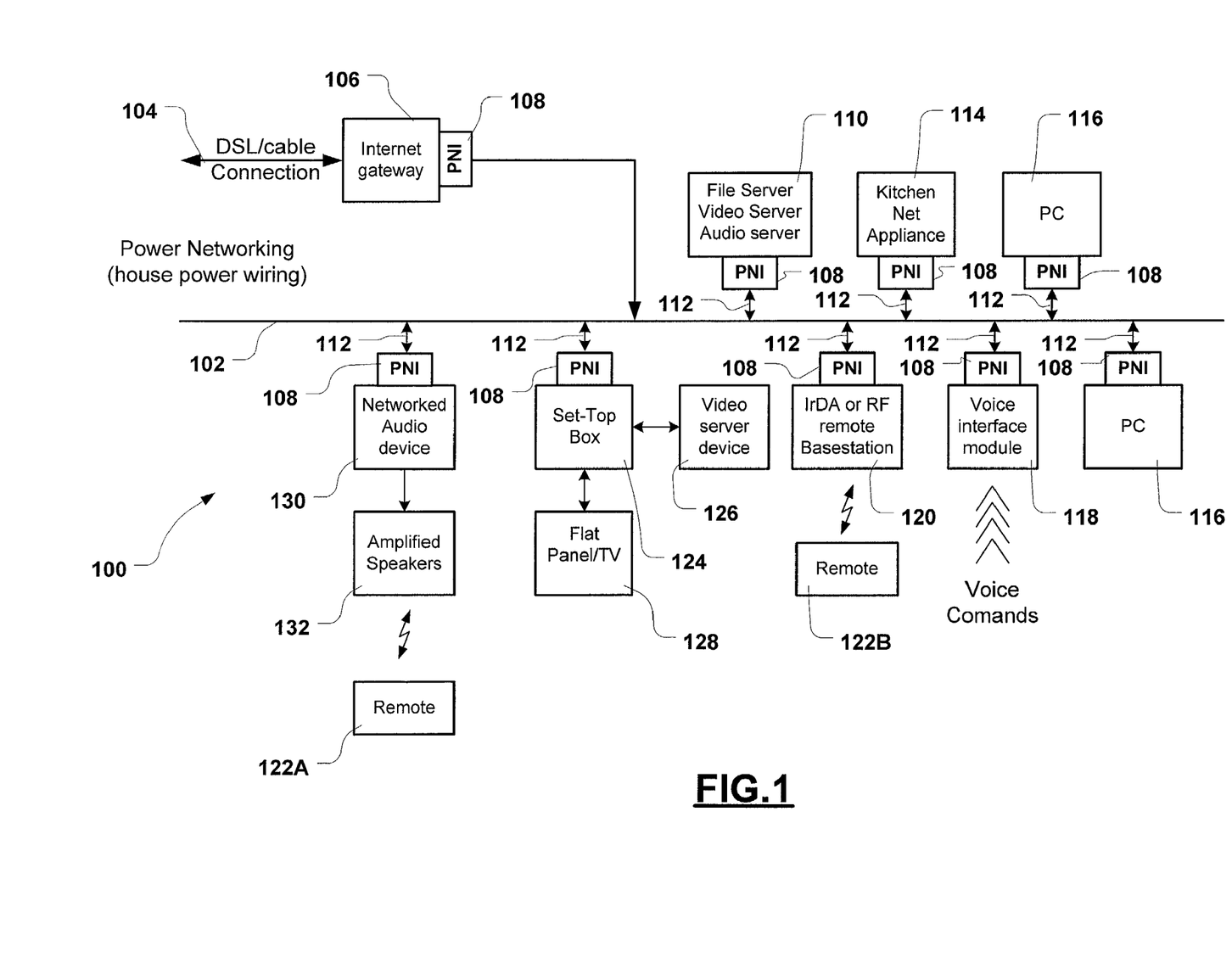
FIG. 1 is a schematic diagram showing a home power distribution network for interconnecting multiple types of electronic devices.

FIG. 1 shows an exemplary home power distribution network 100 used for interconnecting multiple type devices, each of which uses a power network interface (PNI) 108 that is coupled to the power distribution wiring 102 via a connection 112. The home power distribution network 100 may include, for example, data-processing devices such as one or more personal computers 116; a file, video or audio server 110; kitchen net appliance 114; networked audio device 130 that is connected to amplified speakers 132 that can be controlled by a remote control unit 122A; an infrared or a radio frequency base station 120 that can be controlled by a remote control 122B, a voice interface module 118 with voice recognition system; and a set-top box 124 that is connected to a flat panel/TV 128 and also to a video server device 126. The home power distribution network 100 has access to the internet via an internet gateway 106 that is connected to the internet via a DSL or a cable connection 104.

Figure 2:
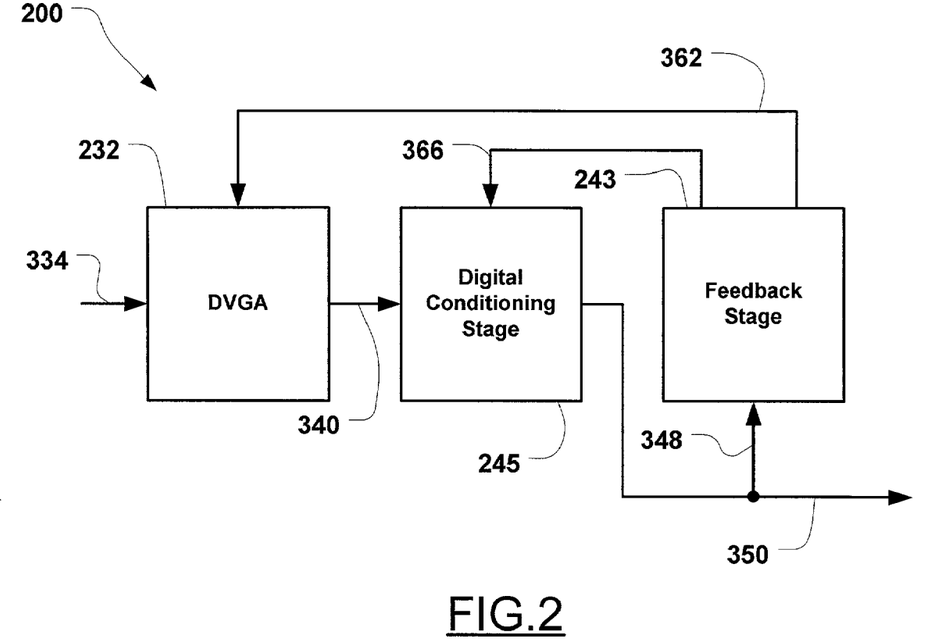
FIG. 2 is a block diagram of an ASGC in accordance with the present invention.

FIG. 2 illustrates an ASGC 200 in accordance with the present invention. The ASGC 200 includes a digital variable gain amplifier (DVGA) 232, a digital conditioning stage 245 and a feedback stage 243. The DVGA 232 has inputs 334 and 362 and an output 340. The DVGA 232 receives an analog signal via input 334 and a gain control signal from the feedback stage 243 via input 362. The DVGA 232 outputs an amplified analog signal via output 340 to the digital conditioning stage 245. The digital conditioning stage 245 receives a second digital control signal via input 366, converts the received analog signal to a digital signal, conditions the digital signal and outputs the digital signal via output 350. The feedback stage 243 analyzes a signal received via input 348, and outputs signals 362 and 366. The signal 362 provides gain control to the DVGA 232 and the signal 366 controls signal conditioning in the digital conditioning stage 245.

Figure 3:
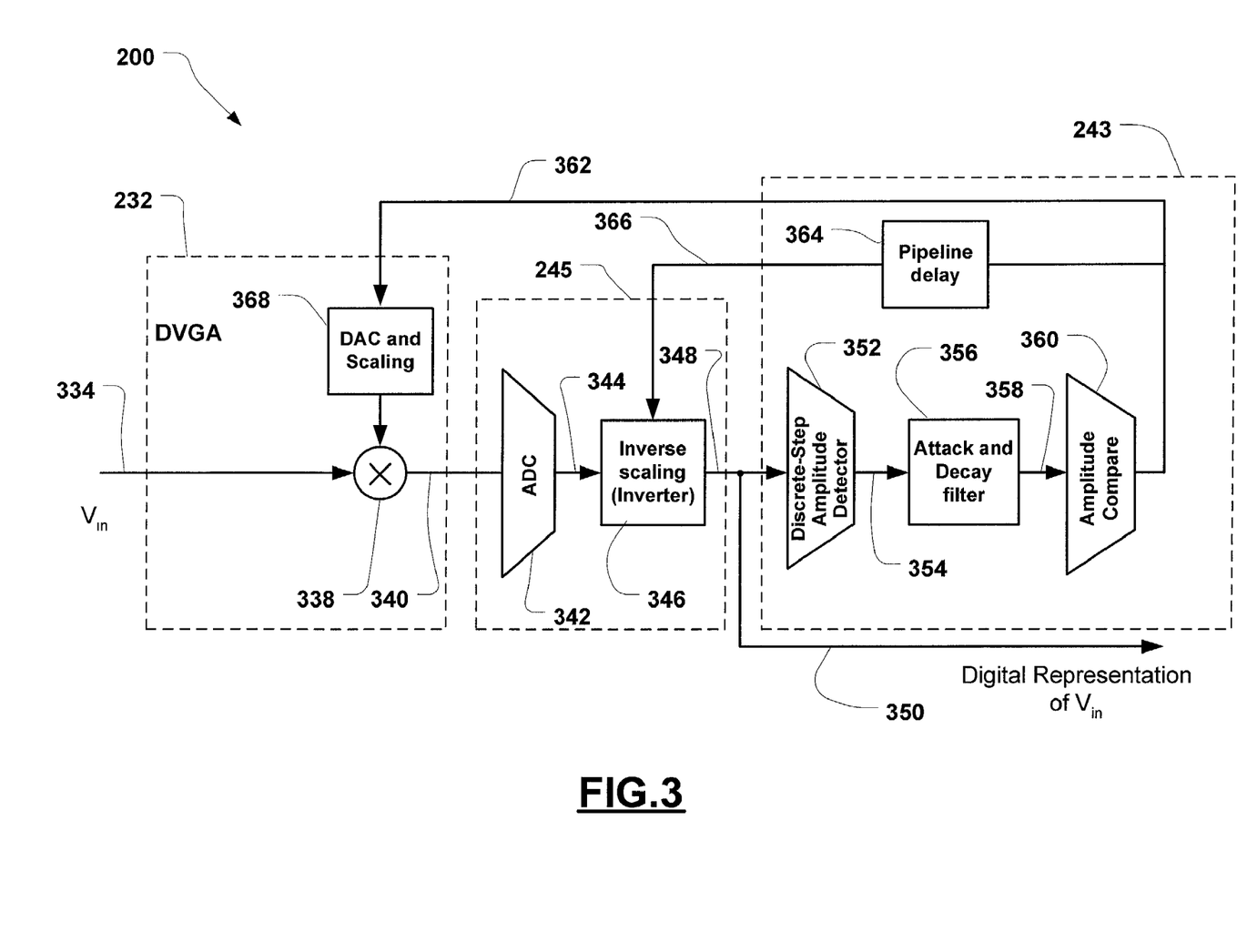
FIG. 3 is a detailed block diagram of the ASGC shown in FIG. 2.

FIG. 3 is a detailed block diagram of an embodiment of the ASGC 200. The DVGA 232 includes an amplifier 338 and a digital-to-analog converter (DAC) and scaling stage 368. The DVGA 232 has a predetermined number of gain control signals. The DVGA 232 may be, for example, a CLC5526, manufactured by National Semiconductor. Additional information about the CLC5526 can be obtained from the worldwide web site of National Semiconductor at "national.com". The DVGA 232 has 8 gain control setting in 6 dB increments from −12 to +30 dB. The DAC and scaling stage 368 enables a digital control of the DVGA, which is accomplished using a 3-bit parallel gain control input 362. An example of the input signal 334 is shown in FIG. 7, as signal 708. In response to the control input 362 received by the DAC and scaling stage 368, the gain applied by the DVGA 232 is controlled so that the output signal 340 matches a dynamic range of an analog-to-digital converter (ADC) 342 of the digital conditioning stage 245. Matching the amplitude of the output signal 340 to the dynamic range of the ADC 342 inhibits clipping of the analog input signal 334.

In addition, the digital conditioning stage 245 includes an inverse scaling stage 346. The inverse scaling stage 346 receives the digital signal from the ADC via ADC output 344 and reverses the scaling performed by the DVGA to output a digital signal that represents an amplitude of the analog input signal 334. The control signal 366 is delayed by a pipeline delay stage 364 to ensure that inverse scaling is applied to the same signal that was scaled by the DVGA 232. The pipeline delay 364 is required due to delays as the input signal passes through the DVGA 232 and the ADC 342. The delay is a constant that is calculated for each combination of a DVGA 232 and an ADC 342. In general, a delay of about 8–16 clock counts is appropriate.

The feedback stage includes a discrete-step amplitude detector 352, the fast attack and slow decay filter 356, an amplitude compare stage 360 and the pipeline delay stage 364. The discrete-step amplitude detector 352 is used instead of a true amplitude detector to simplify hardware implementation. The discrete-step amplitude detector 352 takes an absolute value of the digital input signal received from the inverse scaling circuit 346 and outputs a binary representation of a position of a highest order non-zero bit. For example, if the digital input signal is represented by a positive two's complement seventeen-bit input word with the seventh amplitude bit set, then the discrete-step amplitude detector 352 outputs a binary value of 7. Alternatively, the discrete-step amplitude detector output can be rounded to a nearest amplitude bit, but it has been determined that there is no significant improvement with an OFDM signal, because of a large amplitude spread of OFDM or noise samples. Besides, it is simpler to truncate as described above. The binary output of the discrete-step amplitude detector 354 is input to the fast attack and slow decay filter 356. Scaling to provide smaller DVGA steps is performed by the DAC and scaling circuit 368. This enables reduced width and complexity of the fast attack and slow decay filter 243. The fast attack and slow delay filter output 358 is fed to an amplitude compare stage 360 that converts the output signal from the fast attack and slow decay filter into command signals for the DVGA 232 and the inverse scaling stage 368.

In one embodiment of the invention, the discrete gain steps can be in 6 dB or 2 dB increments, respectively covering at least a 36 dB gain range. The 6 dB gain may be used to reduce complexity of the digital components of the ASGC, with one-bit growth to approximate a 6 dB gain increase. This approximation causes a 0.24% amplitude error for each 6 dB increment. Consequently, the 36 dB range accumulates a 1.4% amplitude estimation error. It is assumed that the receiver operates in a steady state with a fixed gain, or one least significant bit (LSB) toggling while tracking an OFDM signal or noise. This approximation introduces amplitude noise 52 dB below the signal level, which is negligible for most applications. The 1.4% full-scale error shifts the input signal 334 amplitude operating point of the ADC by the same negligible percentage.

Figure 4:
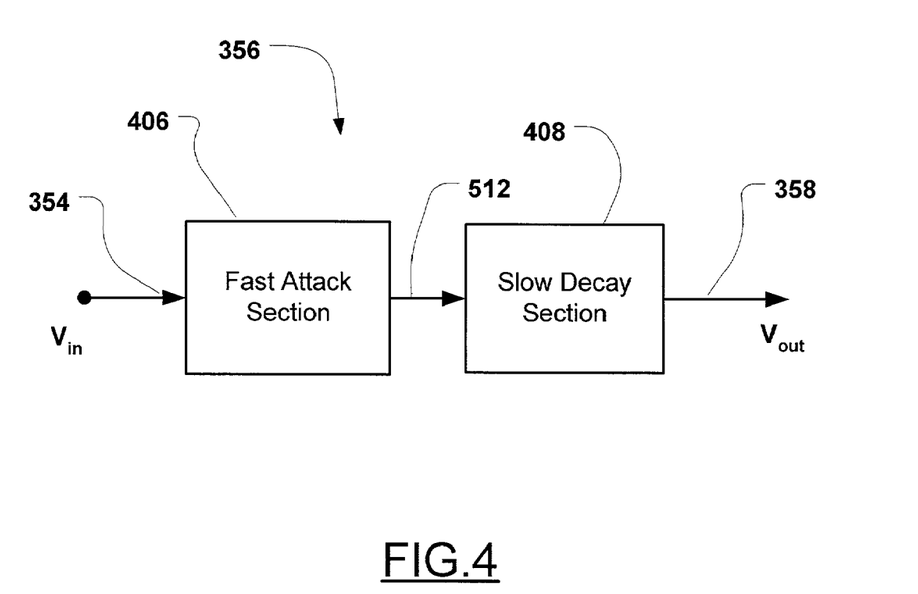
FIG. 4 is a block diagram of a fast attack and slow decay filter shown in FIG. 3.

FIG. 4 schematically illustrates the two stage, non-linear fast attack and slow decay filter 356 in accordance with the invention. The fast attack and slow decay filter 356 includes a fast attack section 406 and a slow decay section 408. The fast attack section 406 receives the input 354 and outputs an output signal 512 to the slow decay section 406. The fast attack section 406 detects increases in amplitude of the input signal 354 and communicates those increases to the slow decay section 408, as will be explained below in more detail. The slow decay section 408 receives the signal 512 output by the fast attack section 406 and ensures a slow decay of the amplitude of the digital output signal 358.

Figure 5:
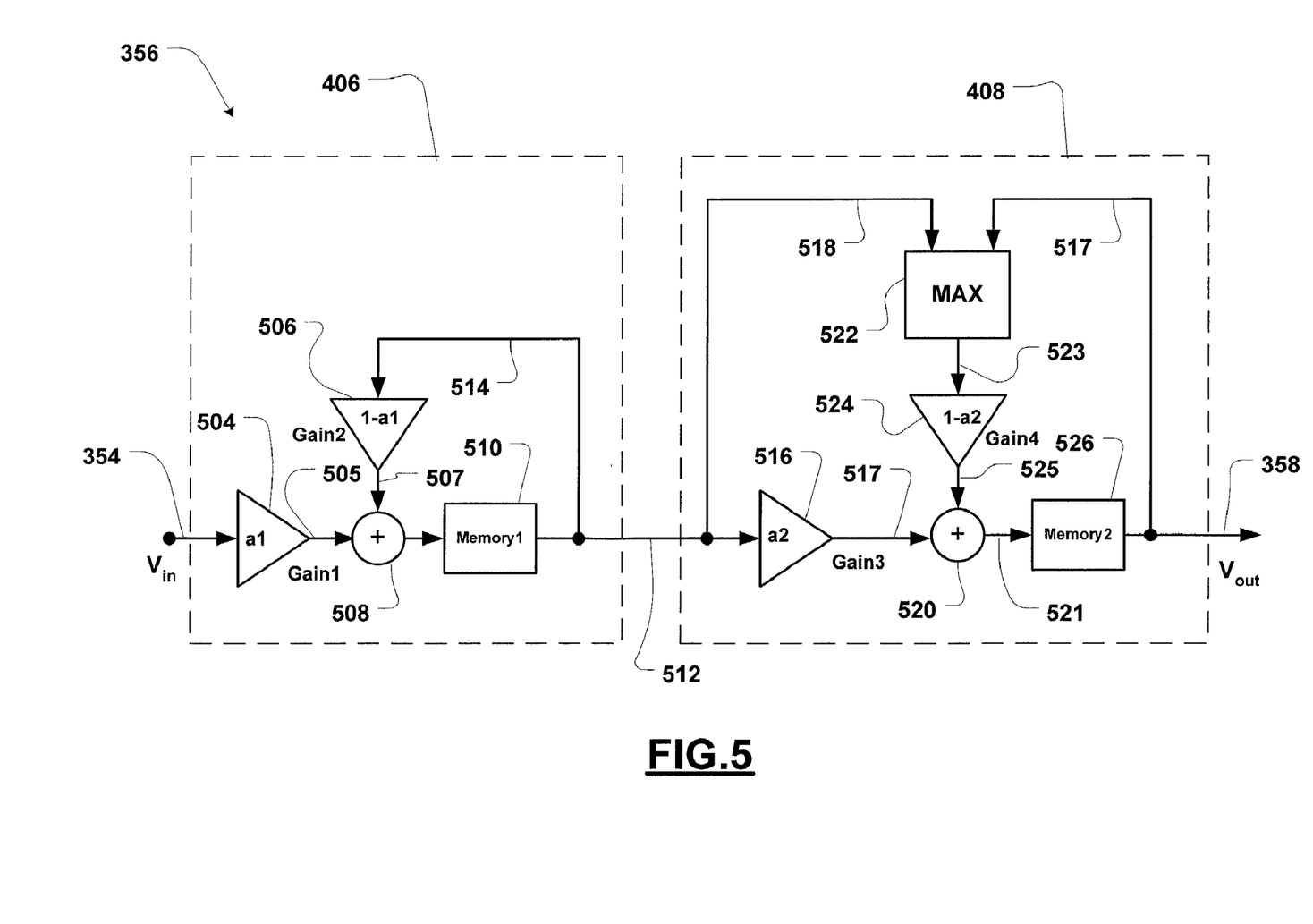
FIG. 5 is a detailed block diagram of the fast attack and slow decay filter shown in FIG. 4.

FIG. 5 is a detailed schematic diagram of an embodiment of the fast attack and slow decay filter 356. The fast attack section 406 includes a first multiplier 504, a second multiplier 506, a first adder 508 and a first delay element 510. The slow decay section 408 includes a third multiplier 516, a fourth multiplier 524, a second adder 520, a second delay element 526 and a comparator 522.

The first multiplier 504, receives the digital input signal 354, multiplies the value of that signal by a first predefined coefficient and outputs a signal to the first adder 508. The second multiplier 506 receives a signal 514 from the first delay element 510, multiplies the value that is output from the first delay element 510 by a second predefined coefficient, which is equal to one minus the value of the first coefficient, and outputs a signal 507 to the first adder. The first adder receives the signal 505 that is output from the first multiplier 504 and the signal 507 that is output from the second multiplier 506, sums the values of both signals 505 and 507, and outputs a result to the first delay element 510.

The third multiplier 516, receives a signal 512 that is output from the first delay element 510, multiplies that signal by a second predefined coefficient and outputs the product to the second adder 520. The comparator 522 also receives the signal 518 that is output from the first delay element 510 and a signal 517 that is output from the second delay element 526. The comparator outputs a maximum value of two signals, 517 and 518, to the fourth multiplier 524. The fourth multiplier 524 multiplies the value received via input 523 by a fourth predefined coefficient, which is equal to one minus the value of the third coefficient, and outputs a signal 525 to the second adder 520. The second adder 520 receives the signal 517 that is output from the third multiplier 516, and the signal 525 that is output from the fourth multiplier 524. The second adder 520 then sums the values of signals 517 and 525, and outputs a result 521 to the second delay element 526.

The fast attack section 406 and the slow decay section 408 together provide a rapid response at the start of a packet to prevent signal clipping, and slow decay to accurately measure the signal power by the end of the first symbol in order to minimize quantization noise.

The fast attack and slow decay filter 356 has constants a1 (or Gain1) and a2 (or Gain3) which are an inverse power of two, so that multiples are completed with a simple bit shift to reduce hardware complexity. The associated feedback constant is 1−a1 (or Gain2) and 1−a2 (or Gain4) respectively to give each section unity signal gain. The feedback equations can be completed using signal subtractions rather than multiplications to reduce filter complexity and logic gate counts. For example, a1 can be assigned a value of $1/16$, in which case 1−a1 would equal $15/16$. This gives the fast attack section 406 a time constant of about 16.5 clock cycles. At the same time, the slow decay filter 408 can be set by assigning a2 a value of $1/512$ and 1−a2 a value of $511/512$, which gives the slow decay section 408 a time constant of about 512.5 clock cycles. These values of the fast attack and slow decay filter are assigned to match a burst packet OFDM signal with 256 clock cycles in the symbol and 7.5 clock cycles in the symbol preamble.

Figure 6:
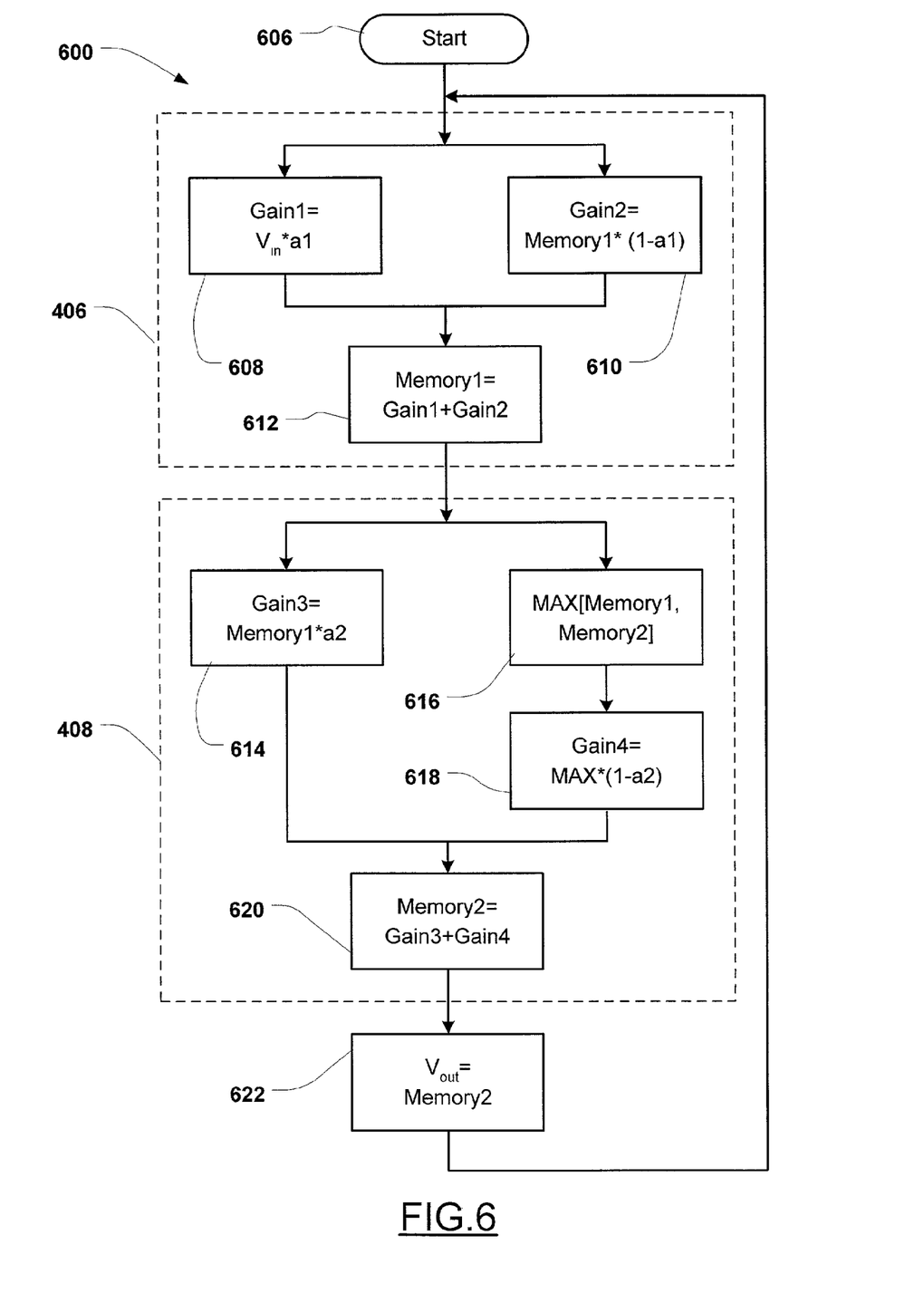
FIG. 6 is a flowchart illustrating the logic that controls the fast attack and slow decay filter in accordance with the present invention.

FIG. 6 is a flowchart 600 illustrating steps performed by the fast attack and slow decay filter while computing gain for the DVGA 232. Steps 608–612 are performed by the fast attack section 406, while steps 614–620 are performed by the slow decay section 408. When the signal $V_{in}$ is received by the fast attack section 406 in step 608, a value of Gain1 is computed, using the formula:

$$Gain1 = V_{in} * a1$$

where $V_{in}$ is a value of the input signal; and
a1 is the first coefficient, e.g., 1/16.

At the same time, in step 610, a value of Gain2 is computed, using the formula:

$$Gain2 = Delay\ Element1 * (1-a1).$$

where Memory1 stores the sum of Gain1 and Gain2.

In step 606, a value of Memory1 is computed using the formula:

$$Delay\ Element1 = Gain1 + Gain2$$

In step 616, a value of Gain3 is computed, using the formula:

$$Gain3 = Delay\ Element1 * a2$$

where a2 is the second coefficient, e.g., 1/512.

At the same time, in step 610, a maximum value of two variables Delay Element1 and Delay Element2 is selected and, in step 618, a value of Gain4 is computed, using the formula:

$$Gain4 = MAX[Delay\ Element1, Delay\ Element2] * (1-a2).$$

In step 620, a content of Delay Element2 is computed using the formula:

$$Delay\ Element2 = Gain3 + Gain4.$$

In step 622, a content of Delay Element2 is output to control gain applied by the DVGA 232. The process is then repeated to continually adjust the gain control setting of the DVGA 232 to ensure that the dynamic range of the ADC 342 is utilized.

The embodiments of the invention described above are intended to be exemplary only. The scope of the invention is therefore intended to be limited solely by the scope of the appended claims.

We claim:

1. A two-stage non-linear filter for analog signal gain control (ASGC) in an orthogonal frequency division multiplexing (OFDM) receiver comprising:
   a discrete-step amplitude detector that receives a digital input signal from an inverse scaling circuit and outputs a digital representation of a magnitude of the digital input signal; and
   a fast attack filter circuit and a slow decay filter circuit connected in series to provide a response to changes in amplitude of the digital representation of the digital input signal, to control a gain control setting of a digital variable gain amplifier (DVGA) for matching a dynamic range of an analog-to-digital converter that receives an output of the DVGA, wherein the fast attack filter circuit detects an increase in the digital representation of the magnitude of the digital input signal, and provides an output signal for rapidly changing a gain signal output to the DVGA, while the slow decay filter circuit ensures a slow decay of the gain signal when the digital representation of the magnitude of the digital input signal decreases, and the slow decay filter continues to decay the output signal as long as an increasing input signal magnitude is less than a magnitude of the decayed gain control signal.

2. The two-stage non-linear filter as claimed in claim 1 wherein the discrete-step amplitude detector takes an absolute value of the digital input signal and outputs a binary representation of a position of a highest order non-zero bit of the digital input signal.

3. The two-stage non-linear filter as claimed in claim 1 wherein the fast attack filter circuit further comprises:
   a first multiplier for multiplying the digital input signal by a first predefined coefficient and outputting a second digital signal to a first adder;
   a first delay element for storing a third digital signal received from the first adder;
   a second multiplier for multiplying a fourth digital signal received from the first delay element by a second predefined coefficient to output a fifth digital signal to the first adder; and
   the first adder for summing the second digital signal with the fifth digital signal to generate the third digital signal, which is output to the first memory.

4. The two-stage non-linear filter as claimed in claim 3 wherein the slow decay filter circuit further comprises:
   a third multiplier for multiplying the fourth digital signal received from the first delay element by a third predefined coefficient and outputting a sixth digital signal to a second adder;
   a second delay element for storing a seventh digital signal received front the second adder;
   a comparator for comparing the fourth digital signal received from the first delay element and an eighth digital signal received from the second delay element, and outputting a ninth digital signal, which is a maximum of the fourth and the eighth digital signals, to a fourth multiplier;
   the fourth multiplier for multiplying the ninth digital signal by a fourth predefined coefficient and outputting a tenth digital signal to the second adder;
   and the second adder for summing the tenth digital signal with the sixth digital signal and outputting the seventh digital signal to the second delay element; wherein the eighth digital signal is output from the second delay element to an amplitude comparator that generates signals to control the DVGA.

5. The two-stage non-linear filter as claimed in claim 1 wherein the gain control setting of the DVGA are associated with discrete amplification steps of the DVGA.

6. The two-stage non-linear filter as claimed in claim 5 wherein the amplification steps of the DVGA are fixed logarithmic amplification steps of 6 dB covering at least a 36 dB range.

7. The two-stage non-linear filter as claimed in claim 6 wherein the amplification steps of the DVGA are fixed logarithmic amplification steps of 2 dB covering at least a 36 dB range.

8. An analog signal gain control circuit (ASGC) for a HomePlug digital radio orthogonal frequency division multiplexing (OFDM) receiver comprising;
   a digital variable gain amplifier (DVGA) having a gain for amplifying a first analog signal to match a predetermined dynamic range of an analog-to-digital converter (ADC) and outputting a second analog signal to a digital conditional stage;

the digital conditioning stage for converting the second analog signal into a first digital signal, conditioning the first digital signal, and outputting a second digital signal; and a feedback stage for receiving the second digital signal, analyzing and outputting a first control signal for controlling the DVGA, and outputting a second control signal for controlling the digital conditioning stage, the feedback stage including an amplitude detector for receiving the second digital signal and outputting a third digital signal to a fast attack and slow decay filter for measuring an amplitude of the third digital signal, and outputting a fourth digital signal in accordance with a predefined algorithm to an amplitude comparator for receiving the fourth digital signal and outputting the first control signal for controlling a gain control settings of the DVGA.

9. A circuit as claimed in claim 8 wherein the digital conditioning stage further comprises:

an analog-to-digital converter (ADC) for converting the second analog signal and outputting a first digital signal to an inverse scaling stage having a scaling factor for scaling the first digital signal and outputting the second digital signal to the feedback stage.

10. A circuit as claimed in claim 9 further comprising a pipeline delay stage for delaying the first control signal for a predefined period of time, and outputting a second control signal to the inverse scaling stage.

11. A method of controlling a gain control setting of a digital variable gain amplifier (DVGA) comprising using a fast attack and slow decay filter to analyze a digital signal output by an analog-to-digital converter (ADC) that digitizes an analog signal output by the DVGA to rapidly scale a control signal when a signal peak is detected in the digital signal, and to permit the control signal to slowly scale when a level of the digital signal output by the ADC drops below the signal peak;

receiving the digital signal at an input of the fast attack filter;

calculating a value for a second digital signal by multiplying a value of the digital signal by a first predefined coefficient; calculating a value for a third digital signal by summing the value of the second digital signal and a value of a fifth digital signal;

storing the value of the third digital signal in a first delay element;

receiving a value of a fourth digital signal from the first delay element;

calculating a value for the fifth digital signal by multiplying the value of the fourth digital signal by a second predefined coefficient; and using the control signal to control the gain control setting of the DVGA.

12. The method as claimed in claim 11 wherein the first predefined coefficient is equal, to unity minus the second predefined coefficient.

13. A method as claimed in claim 11 further comprising:

receiving the fourth digital signal at an input of the slow decay filter;

calculating a value of a sixth digital signal by multiplying the value of the fourth digital signal by a third predefined coefficient;

calculating a value of a seventh digital signal by summing the value, of the sixth digital signal and a value of a tenth digital signal;

storing the value of the seventh digital signal in a second delay element;

receiving the value of an eighth digital signal from the second delay element;

calculating a value for a ninth digital signal by choosing a maximum of the value of the fourth and the eighth digital signals; and calculating a value for the tenth digital signal by multiplying the value of the ninth digital signal by a fourth predefined coefficient.

14. The method as claimed in claim 13 wherein the third predefined coefficient is equal to unity minus the fourth predefined coefficient.

15. A method of analog signal gain control (ASGC) in a HomePlug digital radio orthogonal frequency division multiplexing (OFDM) receiver, comprising:

amplifying a first analog signal received by a digital variable gain amplifier (DVGA) having a gain controlled by a first control signal to match a dynamic range of an analog-to-digital converter (ADC) for digitizing an output of the DVGA;

outputting a first digital signal from the ADC to an inverse scaling stage controlled by a second control signal;

scaling the first digital signal using the inverse scaling stage, and outputting a second digital signal to a discrete-step amplitude detector;

receiving the second digital signal from the inverse scaling circuit and outputting a digital representation of a magnitude of the second digital signal to a fast attack and slow decay fitter;

receiving the digital representation of the magnitude of the second digital signal at the fast attack and a slow decay filter, and outputting a third digital signal to an amplitude comparator;

modifying the third digital signal, using die amplitude comparator arid outputting the first control signal to the DVGA;

delaying the first control signal by a predetermined period of time using a pipeline delay stage, to compensate for a delay as the analog input signal passes through the DVGA and the ADC, and outputting the second Control signal to the inverse scaling stage; and using the first control signal to control the gain of the DVGA.

16. The method as claimed in claim 15 wherein the step of receiving the digital representation of the magnitude of the second digital signal further comprise:

using the fast attack and slow decay filter to determine whether the magnitude of the second digital signal is rising or falling; and rapidly scaling the third digital signal when the magnitude of the second digital signal is rising and greater than the third digital signal, and slowly scaling the third digital signal when the magnitude of the second digital signal is falling and less than the third digital signal.

17. The method as claimed in claim 16 further comprising:

in a fast attack section of the fast attack and slow decay filter, multiplying the magnitude of the second digital signal by a first predefined coefficient to compute a first gain control signal, adding the first gain control signal to a second gain control signal and storing the sum in a delay element, and multiplying the sum stored in the first delay element by a second predefined coefficient to compute the second gain control signal.

18. The method as claimed in claim 17, further comprising:

in a slow decay section of the fast attack and slow decay filter, multiplying the sum stored in the first delay element by a predefined third coefficient to compute a third gain control signal, adding the third gain control signal to a fourth gain control signal and storing the sum in a second delay element, comparing the respective sums stored in the first and second delay elements and selecting a maximum of the two sums, and computing the fourth gain control signal by multiplying the maximum of the two sums by a fourth predefine coefficient.

19. The method as claimed in claim 18 wherein the second predefined coefficient is equal to unity minus the first predefined coefficient.

20. The method as claimed in claim 19 wherein the fourth predefined coefficient is equal to unity minus the third predefined coefficient.

21. An apparatus for controlling a gain applied to an analog signal by a variable gain amplifier, comprising:

a first filter circuit including circuitry to modify a control signal for controlling the gain of the variable gain amplifier in response to an increase in a magnitude of a digital signal that represents an amplitude of the analog signal according to a first time constant;

a second filter circuit connected in series with the first filter circuit to modify the control signal in response to a decrease in the magnitude of the digital signal according to a second time constant that is larger than the first dine constant;

a first multiplier for multiplying the digital input signal by a first predefined coefficient and outputting a second digital signal to a first adder;

a first delay element for storing a third digital signal received from the first adder;

a second multiplier for multiplying a fourth digital signal received from the first delay element by a second predefined coefficient to output a fifth digital signal to the first adder; and the first adder for summing the second digital signal with the fifth digital signal to generate the third digital signal, which is output to the first memory.

22. The apparatus as claimed in claim 21 further comprising a discrete-step amplitude detector that takes an absolute value of the digital signal and outputs a digital representation of a magnitude of the digital signal.

23. The apparatus as claimed in claim 22 wherein the digital representation of the magnitude of the digital signal comprises a binary representation of a position of a highest order non-zero hit of the digital signal.

24. The apparatus as claimed in claim 22 wherein the second filter circuit comprises:

a third multiplier for multiplying the fourth digital signal received from the first delay element by a third predefined coefficient and outputting a sixth digital signal to a second adder;

a second delay element for storing a seventh digital signal received from the second adder;

a comparator for comparing the fourth digital signal received from the first delay element and an eighth digital signal received from the second delay element, and outputting a ninth digital signal, which is a maximum of the fourth and the eighth digital signals, to a fourth multiplier;

the fourth multiplier for multiplying the ninth digital signal by a fourth predefined coefficient and outputting a tenth digital signal to the second adder; and the second adder for summing the tenth digital signal with the sixth digital signal and outputting the seventh digital signal to the second delay element; wherein the control signal is derived at least in part from the eighth digital signal.

25. A method of controlling a gain applied to an analog signal by a variable gain amplifier, comprising:

digitizing an amplitude of an analog signal output by the variable gain amplifier to provide a digital signal, including an analog output signal of the variable gain amplifier and scaling the digitized analog output according to an inverse of a gain applied by the variable gain amplifier to the analog output signal to provide the digital signal;

analyzing the digital signal to provide a control signal for controlling the gain of the variable gain amplifier, including rapidly scaling the control signal in response to an increase in a magnitude of the digital signal, and slowly scaling the control signal in response to a decrease in the magnitude of the digital signal; and using the control signal to control the gain of the variable gain amplifier.

26. The method as claimed in claim 25 wherein analyzing the digital signal comprises taking an absolute value of the digital signal to provide a digital representation of a magnitude of the digital signal.

27. The method as claimed in claim 25 wherein analyzing the digital signal comprises determining whether the magnitude of the digital signal is rising or falling.

28. The method as claimed in claim 27 wherein providing the control signal comprises rapidly scaling an output signal when the magnitude of the digital signal is rising and greater than the output signal, and slowly scaling the output signal when the magnitude of the digital signal is falling and less than the output signal, and deriving the control signal based on the output signal.

* * * * *